United States Patent

Nam et al.

[11] Patent Number: 5,965,947
[45] Date of Patent: Oct. 12, 1999

[54] STRUCTURE OF A SEMICONDUCTOR PACKAGE INCLUDING CHIPS BONDED TO DIE BONDING PAD WITH CONDUCTIVE ADHESIVE AND CHIPS BONDED WITH NON-CONDUCTIVE ADHESIVE CONTAINING INSULATING BEADS

[75] Inventors: Shi-baek Nam, Inchon; Seung-kon Mok, Kyonggi-do; Dae-hoon Kwon, Seoul, all of Rep. of Korea

[73] Assignee: SamSung Electronics Co., Ltd., Suwon, Rep. of Korea

[21] Appl. No.: 08/914,270

[22] Filed: Aug. 19, 1997

[30] Foreign Application Priority Data

Aug. 20, 1996 [KR] Rep. of Korea ............ 96/34490
Aug. 20, 1996 [KR] Rep. of Korea ............ 96/34491

[51] Int. Cl.[6] ............ H01L 23/54; H01L 23/34; H01L 23/28
[52] U.S. Cl. ............ 257/783; 257/789; 257/779; 257/723; 257/794; 257/795; 257/738; 257/701
[58] Field of Search ............ 257/701, 737, 257/738, 723, 734, 778, 789, 788, 779, 685, 687, 782, 783, 794, 795

[56] References Cited

U.S. PATENT DOCUMENTS

| | | | |
|---|---|---|---|
| 4,514,580 | 4/1985 | Bartlett | 257/794 |
| 5,182,628 | 1/1993 | Izawa et al. | 257/783 |
| 5,349,240 | 9/1994 | Narita et al. | 257/795 |
| 5,389,817 | 2/1995 | Imamura et al. | 257/666 |
| 5,455,452 | 10/1995 | Kiyono | 257/668 |
| 5,497,033 | 3/1996 | Fillion et al. | 257/795 |
| 5,629,566 | 5/1997 | Doi et al. | 257/789 |
| 5,756,207 | 5/1998 | Clough et al. | 428/375 |

Primary Examiner—Alexander Oscar Williams
Attorney, Agent, or Firm—Robert E. Bushnell, Esq.

[57] ABSTRACT

In a semiconductor package which includes a plurality of semiconductor chips of different kinds, some of the chips are bonded to die bonding pad by means of a conductive adhesive, while the other chips are bonded by means of a non-conductive adhesive that contains highly insulating beads. Encapsulation of the package is by a molding compound. A nitride film or an organic insulating film is disposed on a back side of the chips bonded by the non-conductive adhesive to improve the withstand voltage between these chips and the die pad.

15 Claims, 4 Drawing Sheets

5,965,947

STRUCTURE OF A SEMICONDUCTOR PACKAGE INCLUDING CHIPS BONDED TO DIE BONDING PAD WITH CONDUCTIVE ADHESIVE AND CHIPS BONDED WITH NON-CONDUCTIVE ADHESIVE CONTAINING INSULATING BEADS

This application makes reference to, incorporates the same herein, and claims all benefits accruing under 35 U.S.C. §119 from two applications both entitled *STRUCTURE OF A SEMICONDUCTOR PACKAGE*, both filed in the Korean Industrial Property Office on the 20th day of August 1996 and there duly assigned Ser. Nos. 34490/1996 and 34491/1996, copies of which applications are annexed hereto.

BACKGROUND OF THE INVENTION

Field of the Invention

The present invention relates to a structure of semiconductor package, and more particularly, relates to a semiconductor package which includes a plurality of semiconductor chips of different kinds. In the package, some of the chips are bonded to die bonding pad by means of a conductive adhesive, while other chips are bonded by means of a non-conductive adhesive that contains highly insulating beads. Encapsulation of the package is by a molding compound.

DESCRIPTION OF THE RELATED ART

Nowadays, a trend in the electronic production is to produce smaller and lighter products. In order to meet the trend, manufacturers are continuously making a progress on producing electronic components with high packaging density. A switching mode power supply (SMPS) is one of the examples of such a development. This method involves combining a semiconductor IC (integrated circuit), which consumes a large amount of electricity and produces much heat, and a control IC together. For instance, a metal oxide semiconductor field effect transistor (MOSFET), which is used as a power transistor, and its control IC are combined into one encapsulated package.

First of all, in order to accomplish the task, a switching element and the control IC should be designed to be able to communicate with each other inside the package through wire bonding. Secondly, it should be designed to enable the functions of peripheral components to be combined into the control IC. Finally it should also be designed such that both the switching element and the control IC are included in one package.

Especially, in the development of a package, in order to avoid a short-circuit between the control IC and the switching element, such as a MOSFET drain, an insulating adhesive should be used.

In such a package as mentioned above, a control IC and a power IC, which has a MOSFET or a bipolar IC structure, are located on a pad of a lead frame. Since the back side of the power IC is used as a drain, the power IC is bonded to the die pad by means of an electrically conductive medium, such as a solder adhesive. On the other hand, since the control IC needs to be electrically separated from the die pad, an insulating resin adhesive must be used for die bonding. When the power IC, such as a MOSFET, is in operation, a voltage of about 800 V flows into the drain and the die pad which is electrically connected to the power IC. In order to sustain the insulation between the die pad and the control IC under such a high voltage, a highly insulation adhesive is required. Due to the importance of the insulation considerable effort has been made to improve the withstand voltage of the insulating adhesive.

Inner leads, the power IC, and the control IC are interconnected by wire bonding, which is followed by molding and trimming processes to complete the package.

Generally, a conventional method to improve a withstand voltage is to control the thickness of the insulating adhesive layer. A semiconductor die according to U.S. Pat. No. 5,012,322 to Raul A. Guillotte et al., issued Apr. 30, 1991, uses such a conventional method.

A silicon die is bonded to a metal supporting substrate. Insulating resin layers are formed on the backside of silicon die, which is bonded to the metal substrate by means of an epoxy adhesive. The silicon die is a silicon integrated circuit comprised of a plurality of semiconductor devices formed on the major surface of die. One of these devices is a standard double diffused NPN transistor formed in one of the N-type epitaxial pockets.

Another semiconductor chip is also provided. This chip may be a discrete power transistor. A bottom face thereof is used as a boundary of a collector of the transistor. A layer of solder bonds the die to the substrate.

The insulating resin layers are formed by coating one or more dielectric resins successively on the back face of the die. This is accomplished by pouring liquid resin on the horizontally held wafer and spinning the wafer to render the film uniformly thin.

According to Guillotte et al., a withstand voltage can be improved up to 200 V or more by adding a number of insulating resin layers. However, although the withstand voltage is proportional to the thickness of the insulating resin layers, in reality, the thickness of the layers has its limit in forming process.

In order to form the insulating resin layer according to above mentioned method, liquid resin is spin-coated on the wafer. The spin coating of liquid resin on the back side of wafer needs some extra attention and caution to prevent such problem as resin dripping during the coating process. In addition, since controlling the insulating layer thickness precisely is becomes difficult, controlling the range of withstand voltage also becomes difficult. As a result, the reliability of semiconductor chip becomes unpredictable. For example, when trying to form an insulating resin layer having 1.0 mil thickness, the actual margin for error is 1.0 ±0.5 mil. As a result, the withstand voltage may range from 500 V to 3000 V.

In case of the MOSFET as mentioned above, when the voltage reaches 800 V, there is a possibility of an insulation breakdown which doesn't occur frequently, but the fact it can happen, raises a serious doubt as to its reliability. In other words, in terms of the reliability of the semiconductor chip, even if an insulation breakdown only occurs rarely, the fact that it can happen, raises a serious doubt as to its reliability. Only when there is no insulation breakdown at 800 V and under any exterior circumstances, is a semiconductor chip considered to be reliable.

While the following patents each disclose features in common with the present invention, they do not teach or suggest a semiconductor package utilizing insulation beads added to an insulating adhesive and an insulation film of nitride or an organic substance as is in the present invention: U.S. Pat. No. 5,539,218 to Takahama et al., entitled *Semiconductor Device And Resin For Sealing A Semiconductor Device*, U.S. Pat. No. 5,526,867 to Keck et al., entitled Methods Of Forming Electronic Packages, U.S. Pat. No. 5,483,106 to Echigo et al., entitled Semiconductor Device For Sensing Strain On A Substrate, U.S. Pat. No. 5,480,957 to Muroi et al., entitled Spherical Curing Agent For Epoxy Resin, Curing Agent Masterbatch For Epoxy Resin And Their Preparation, U.S. Pat. No. 5,434,357 to Belcher et al., entitled Reduced Semiconductor Size Package, U.S. Pat. No. 5,293,511 to Poradish et al., entitled Package For A Semiconductor Device, U.S. Pat. No. 5,252,888 to Topel et al., entitled Lamp Capsule Support Base, U.S. Pat. No. 5,159,750 to Dutta et al., entitled Method Of Connecting An IC component With Another Electrical Component, U.S. Pat. No. 5,113,241 to Yanagida et al., entitled Semiconductor Device Mounted Upon An Insulating adhesive With Silicon Dioxide And Nickel Chromium Steel Filling Particles, U.S. Pat. No. 5,008,734 to Dutta et al., entitled Stadium-Stepped Package For An Integrated Circuit With Air Dielectric, U.S. Pat. No. 5,001,542 to Tsukagoshi et al., entitled Composition For Circuit Connection, Method For Connection Using The Same, And Connected Structure Of Semiconductor Ships, U.S. Pat. No. 4,940,623 to Bosna et al., entitled Printed Circuit Board And Method Using Thermal Spray Techniques, U.S. Pat. No. 4,888,634 to Lai et al., entitled High Thermal Resistance Bonding Material And Semiconductor Structures Using Same, U.S. Pat. No. 4,092,487 to Imai, entitled Resin-Sealed Electrical Device, U.S. Pat. No. 3,670,097 to Jones, entitled Stereoscopic Television System And Apparatus, U.S. Pat. No. 3,568,012 to Ernst, entitled A Microminiature Circuit Device Employing A Low Thermal Expansion Binder, and U.S. Pat. No. 4,293,519 to Knappenberger et al., entitled METHOD FOR POTTING AND ENCAPSULATING ELECTRONIC CIRCUITS.

SUMMARY OF THE INVENTION

An object of the present invention is to provide a semiconductor package in which the thickness of insulating adhesive layer can be easily controlled. Another object of the present invention is to provide a low cost semiconductor package which has a high withstand voltage and a good reliability.

According to the first embodiment of the invention, the package includes at least one semiconductor chip, which is attached to a die pad by means of a conductive adhesive, and the inner leads which are connected to the semiconductor chips by bonding wires. In the present invention, insulating beads of a predetermined size are added to the insulating adhesive in order to gain an expected withstand voltage between chips and the die pad. Ideally, the insulation beads should have a small amount of alkaline element or no alkaline element. Specifically, the ideal amount of alkaline element is less than 5%. The beads can be made of pure silica, boron silicate glass, or soda lime glass, etc.

According to another embodiment of the present invention, the package comprises: at least one semiconductor chip and a die pad which is attached to a die pad by means of conductive adhesive; at least one semiconductor chip which should be electrically insulated from the die pad by using insulating adhesive; and the inner leads which are connected to the semiconductor chips by bonding wires. Insulation beads having predetermined sizes are added to the insulating adhesive in order to gain a uniform withstand voltage between the chip and the die pad. In addition, the back side of the chip which needs an insulation includes a nitrified film or benzo-cyclo-butene (BCB) film. The ideal thickness of the film is 2~5 $\mu$m.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
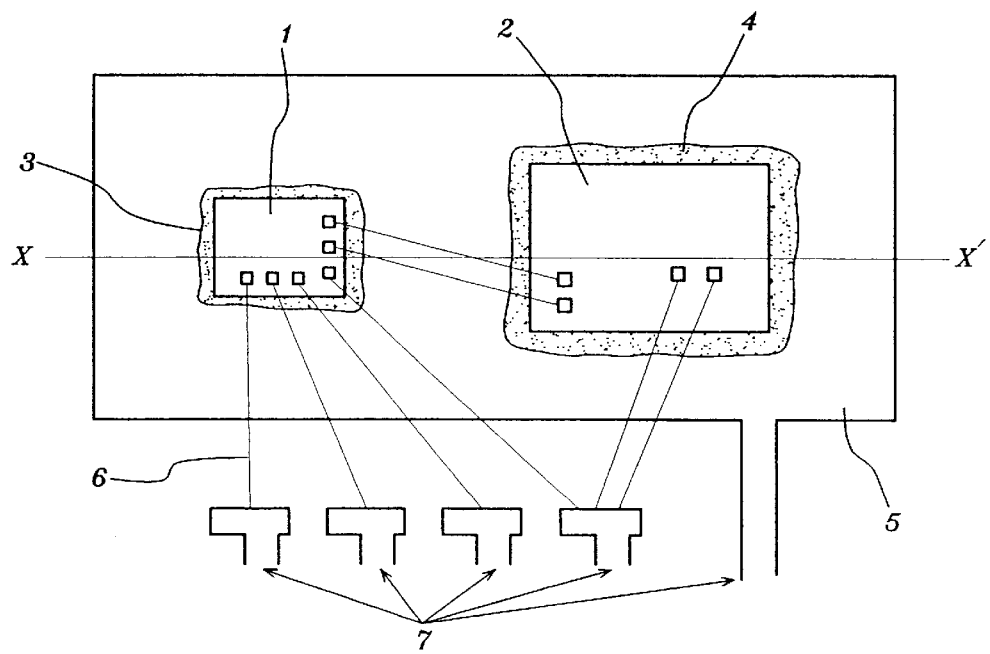
FIG. 1 is a plane view of a semiconductor package that has two types of IC.

FIG. 1 is a plan view of a semiconductor package having two types of IC as discussed in the Description of the Related Art above.

In FIG. 1, a control IC 2 and a power IC 1 are located on a pad 5 of a lead frame. The power IC 2 is bonded to the die pad 5 by an electrically conductive medium such as a solder adhesive 4 while the control IC is bonded to the die pad by an insulating resin adhesive 3. Inner leads 7, the power IC 2, and the control IC 1 are interconnected by wire bonding which is followed by molding and trimming processes to complete the process.

Figure 2:
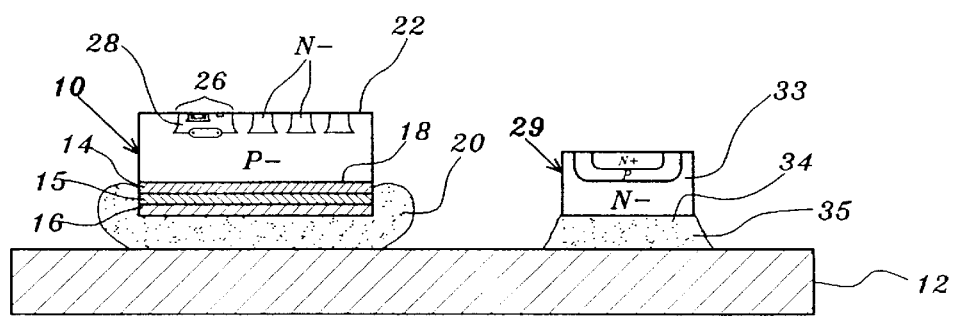
FIG. 2 is a crosssectional view of a conventional semiconductor package.

FIG. 2 is a view of a semiconductor die according to U.S. Pat. No. 5,012,322, discussed in detail above.

In FIG. 2, a silicon die 10 is bonded to the metal supporting substrate 12 and insulating resin layers 14, 15, and 16 are formed on the back side of the silicon die 10 which is bonded to the metal substrate 12 by means of an epoxy adhesive 20. The silicon die 10 is a silicon integrated circuit formed on the major surface 22 of the die 10. The semiconductor devices comprising the silicon integrated circuit is a standard double diffused transistor formed in one of the N-type epitaxial pockets 28.

Another semiconductor ship 29 is also provided and this chip may be a discrete power transistor. A bottom face 34 is used as a boundary of a collector 33 of the transistor and a layer of solder 35 bonds the die to the substrate 12.

The preferred embodiment herein described is intended to explain better about the present invention. By relating to actual experiments and the enclosed drawings, the present invention's object, uniqueness, and advantages will clearly be served.

It is almost impossible to precisely control the thickness of liquid insulating epoxy resin. Therefore, in order to precisely control the thickness, a spacer, which has a certain size, is needed. The spacer, which has a quality of a solid, should be added to the insulating epoxy resin. If the thickness of liquid insulating epoxy resin can be precisely controlled, then the thickness can be controlled to have enough withstand voltage. In turn, a reliable IC can be produced.

Beads, which have little or no alkaline element can be added to the insulating epoxy resin adhesive to act as the spacer. The main reason for refraining from using an alkaline element is that when a high voltage flows to an alkaline element, then the alkaline element ionizes. Due to the ionization, electric conduction occurs, which decreases the withstand voltage and mechanical integrity of the beads. As a result, the bead itself may breakdown, and an insulation breakdown can occur in the package.

Figure 3:
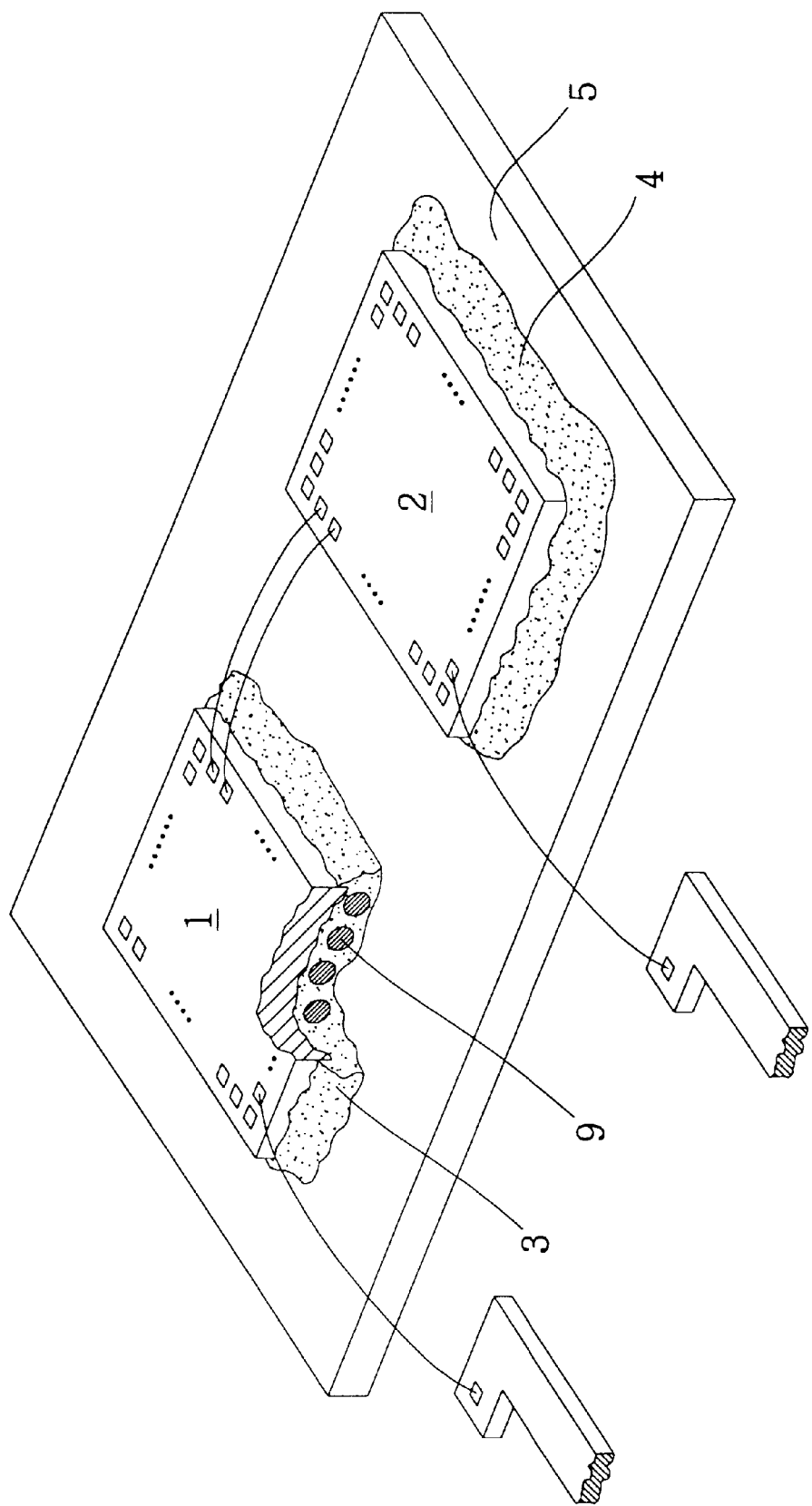
FIG. 3 is a view of semiconductor package according to a preferred embodiment of the present invention.

FIG. 3 is a view of the package according to a preferred embodiment of the present invention.

The power IC 2, such as a MOSFET or a bipolar IC, and control IC 1 are located on the top of the die pad 5 of the lead frame. At this time, the back side of the power IC 2 is used as a drain. Therefore, a conductive adhesive, such as solder 4, is used to bond the power IC 2 to the die pad 5. On the other hand, the control IC 1 should be electrically isolated from the die pad 5. Therefore, the insulating epoxy adhesive 3 is used to attach the control IC 1 to the die pad 5.

Furthermore, insulating beads 9 are added to the epoxy adhesive which connects the control IC 1 to the die pad 5. By adding the beads, the thickness of the epoxy adhesive can be precisely controlled. Therefore, it is possible to render a precise thickness to accomplish the necessary withstand voltage.

The following describes the insulating bead in specific detail.

In general, the epoxy adhesive is composed of 40% epoxy, 50% $SiO_2$ filler, and other elements. The beads are often made of $SiO_2$ which is a component of the epoxy adhesive to make the easier process of adding the beads. For this matter, soda lime glass, which usually includes SiO2, is used to make a bead with a uniform diameter. Afterwards, the finished bead will be added to the epoxy adhesive. Next, the epoxy resin with the insulating bead is used to connect the control IC 1 to the die pad 5. The package is finally completed after the molding process.

Experiment 1

Three epoxy adhesives were prepared for the breakdown voltage (B/V) test in the room temperature. The first adhesive contained no bead, and the last two adhesives contained a bead having 1 mil and 3 mil respectively. The results are presented in <Table 1>.

TABLE 1

| TYPE | BEAD ADDED | THICKNESS OF EPOXY ADHESIVE | B/V at ROOM ° C. |
|------|------------|------------------------------|-------------------|
| A | none | 2~46 μm | 500~3800 |
| B | 1 mil | 6~54 μm | 800~4500 |
| C | 3 mil | 44~84 μm | 1800~>5000 V |

The result indicates that the effect of insulation breakdown is directly correlated to the thickness of the epoxy resin. The epoxy adhesive which included the bead having a 3 mil diameter showed the highest voltage range from 1800 V to over 5000 V. The thickness of the epoxy adhesive was approximately 44~84 μm. The epoxy adhesive without a bead showed the lowest voltage range of from 500 V to 3800 V. In case of the adhesive having no bead, since the withstand voltage of MOSFET should be at least 800 V, there is a chance of insulation breakdown, and the reliability definitely becomes questionable. In the experiment, the epoxy adhesive was cured at 150° C. for an hour. Based on the result, it can be concluded that the ideal diameter for the insulating bead is more than 1 mil. In this experiment, although a glass bead was used, other insulating beads, such as a ceramic bead can be used.

In the present invention, since the thickness of the insulating epoxy adhesive can be precisely can be controlled by means of adding the insulating beads, it is possible to predict a range of withstand voltage. Moreover, since the glass bead itself is dielectric, as mentioned, the withstand voltage is improved, and the reliability of package is greatly improved as well.

In the present invention, in order to improve the reliability, the insulating bead should be made of insulating substances. The substances should have little or no alkaline elements.

The use of the insulating beads can produce a relatively reliable package with high withstand voltage. However, it is difficult to conclude that it is reliable under any extreme condition, such as the high temperature reverse bias (HTRB) test, in which the temperature was raised from the room temperature to 125° C., and the samples were left for 500 hours at 800 V. After the test, incase of the bead of having 3 mil or 5 mil diameter, there was an insulation breakdown in about 5% of the total sample. However, in case of the bead having 1 mil diameter, there was a significant number insulation of breakdowns. In other words, there is a strong possibility of an insulation breakdown under some extreme condition.

The fact that there was an insulation breakdown of the package with the beads having 3 mil and 5 mil diameter, it was concluded that there might be other factors causing the breakdown. In other words, an insulation breakdown may not just be correlated to the insulating bead's diameter.

The beads used in the experiment were made of soda lime glass, which includes such components other than SiO2 as Na2O, K2O, CaO, and MgO etc. These components usually include alkaline elements which have the atomic valence of 1 or 2 when a high voltage flows into the beads, those alkaline elements will be ionized. As a result, electric conduction through the beads occurs, and in turn, the withstand voltage and mechanical integrity of the epoxy adhesive decrease. Consequently, since the beads break down, there occurs an insulation breakdown in the package as a whole.

Soda lime glass usually contains 14% alkaline element and has the insulation breakdown at about 5~20 KV/mm. Therefore, in order to improve the reliability of semiconductor package, the insulating beads should be made of the substance that has little or no alkaline elements.

As shown in <Table 2>, boron silicate glass is one of the substances that has little or no alkaline elements. In comparison to soda lime glass, it is highly pure; it contains only about 3% alkaline elements. Moreover, pure SiO2 glass was also considered for the beads.

TABLE 2

| | SODA LIME GLASS | BORON SILICATE GLASS | QUARTZ GLASS |
|---|---|---|---|
| COMPOSITION | $SiO_2$ (70%) $Na_2O$, $K_2O$ (14–18%) CaO (5–7%) MgO (4%) | $SiO_2$ (70%) $B_2O_3$ (14%) $Na_2O$ (3%) $K_2O$ (1%) | $SiO_2$ (70%) |
| COMPRESSIVE STRENGTH | 700~1400 Kg/cm$^3$ | 1300~2000 Kg/cm$^3$ | 1400 Kg/cm$^3$ |
| TENSILE STRENGTH | 150~350 Kg/cm$^3$ | 150~250 Kg/cm$^3$ | 560 Kg/cm$^3$ |
| INSULATION BREAKDOWN | 5~20 KV/mm (50 Hz) | 20~35 KV/mm (50 Hz) | 25~40 KV/mm (50 Hz) |

Boron silicate glass beads were prepared and added to an epoxy resin adhesive. The epoxy adhesive with the boron silicate glass beads was is used to attach the control IC 1 to the die pad. After a molding process, the packages were prepared and tested under HTRB condition.

Insulation breakdown occurred at approximately 20~35 KV/mm. In the HTRB test, the package was put at 640 V, and the temperature was raised from the room temperature to 125° C. for 500 hours. Subsequently, there was no insulation breakdowns. Similarly, in case of the pure SiO2, bead in the epoxy adhesive, the insulation breakdown did not occur at all, either. Therefore, it can concluded that the ideal amount of alkaline elements in a bead is less than 5%.

Figure 4:
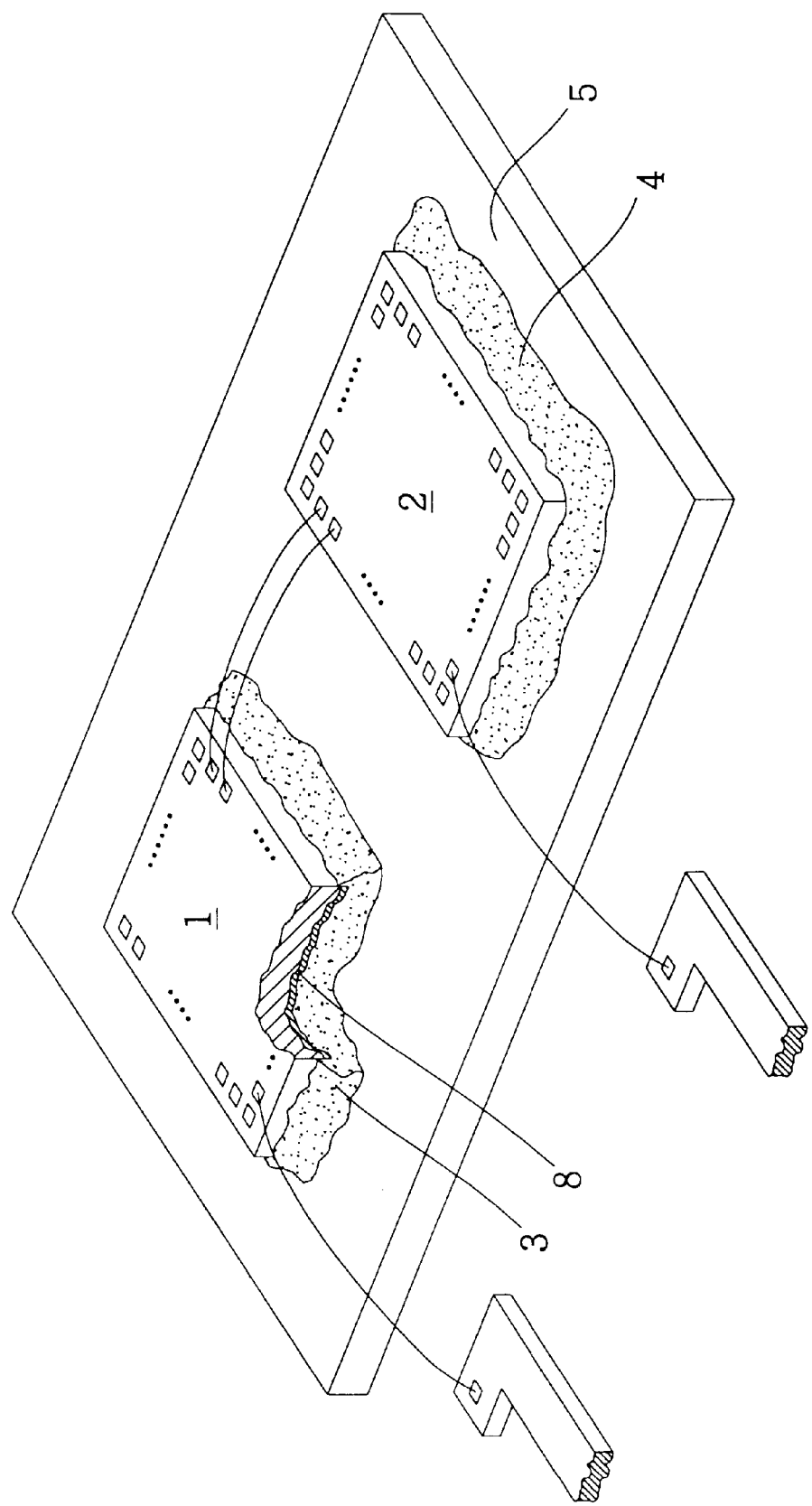
FIGS. 4 and 5 are views of semiconductor packages according to other preferred embodiments of the present invention.

FIG. 4 is a view of another embodiment of the present invention.

As illustrated, a nitride ($Si_xN_y$) film 8 with a certain thickness is formed on the back side of control IC 1. The ideal thickness is approximately 2~5 $\mu$m. For instance, the film, such as $Si_3N_4$, is applied to the back side of wafer to yield a thickness of 2~5 $\mu$m. One application usually yields about 1 $\mu$m. Therefore, $Si_3N_4$ is applied several times to produce a desirable thickness.

The next step is to saw the wafer to separate individual control ICs, and the control IC 1 is bonded to die pad 5 using the insulating resin adhesive. The MOSFET (power IC) 2 is attached by means of solder adhesive. The inner leads are interconnected to the two IC's by using bonding wires. Finally, the package is completed after molding and trimming process.

The withstand voltage of the package with a nitride layer was measured. The result indicates that the withstand voltage varied according to the thickness of nitride film. For example, when only 1 $\mu$m was applied, the withstand voltage was about 600 V. However, when 2 $\mu$m was applied, the withstand voltage increased to about 1000 V. As a result, considering the cost factor, the effective thickness of a nitride film in the present invention is 2~5 $\mu$m. It should be mentioned that instead of the nitride film, an organic insulating film, such as benzo-cyclo-butene (BCB), can be applied.

Experiment 2

Figure 5:
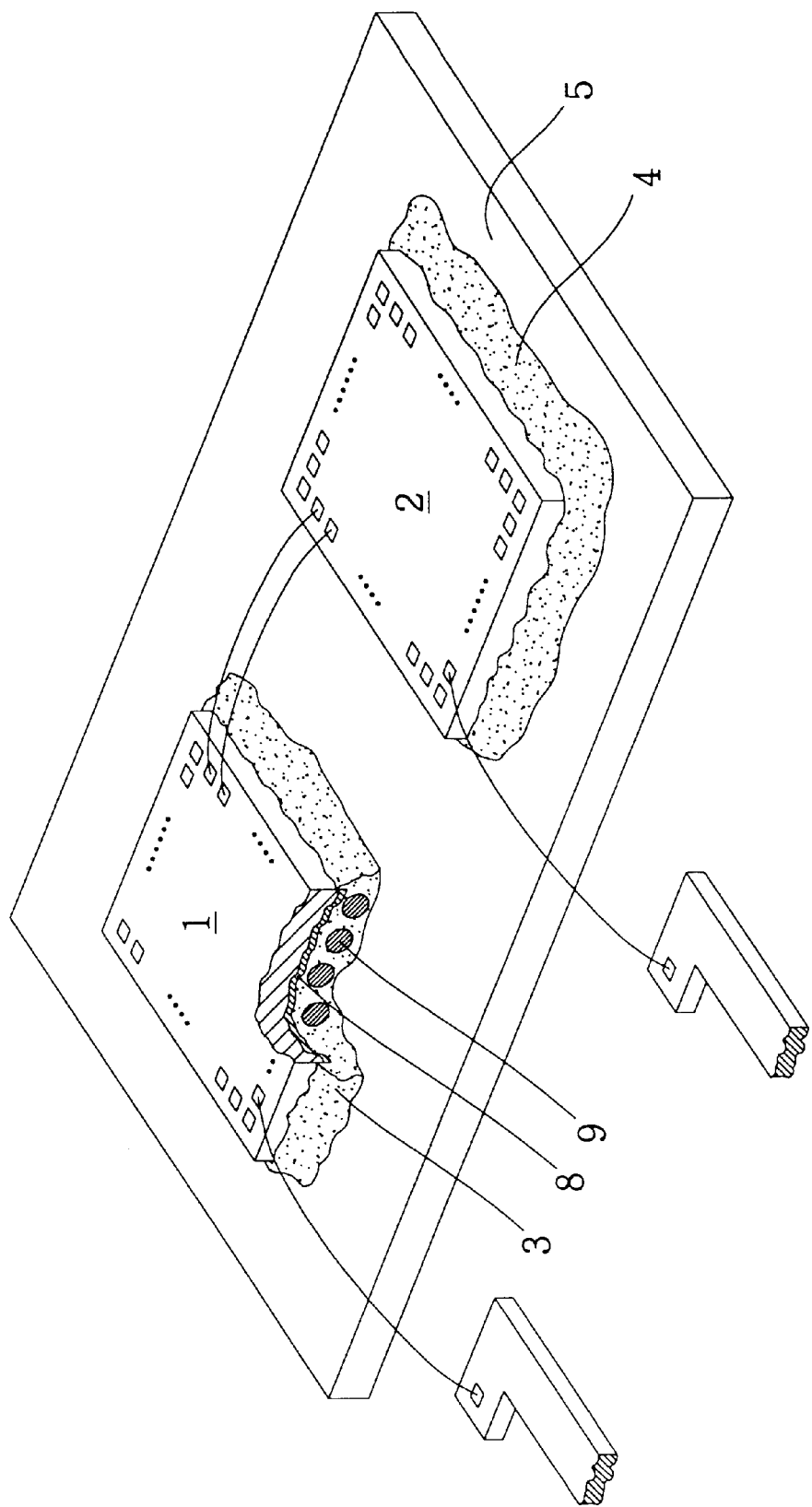

Silicon nitride was applied twice on the back side of the wafer. Package samples were made using the epoxy adhesive which contains 5 mil bead. FIG. 5 illustrates such an embodiment. The B/V test of the sample was performed at the room temperature and at 125° C. The result was that the sample with silicon nitride showed a higher B/V than the sample without silicon nitride.

According to the present invention, the withstand voltage is increased by applying a nitride film on the back side of IC. Since the film is formed by vapor deposition, there is no danger of dripping.

In sum, the present invention relates to a semiconductor package in which a number of chips in different kinds are included. In the package, some of them are bonded to a die bonding pad through a conductive adhesive. The other chips are bonded by means of an insulating adhesive that contains highly insulating beads. These differently bonded chips are encapsulated into a package by molding compounds. By adding the insulating bead to the insulating adhesive, the thickness of the adhesive layer can be precisely controlled, and the withstand voltage of the package is greatly improved. Moreover, by selecting beads which have little or no alkaline elements, the withstand voltage further increases, and the reliability of the package is, overall, enhanced.

The preferred embodiments described above are intended to explain the principles of the invention. It application and practical use may be altered or changed in a several ways by others skilled in the art without violating this invention's claim area. For example, a nitride film or BCB can be spin-coated on the back side of a control IC. Then the epoxy adhesive with an insulating bead can be used. Furthermore, an insulating bead having little or no alkaline elements can be used as well. Because of the insulating nature of IC itself, the withstand voltage may increase. The increase in the withstand voltage allows the thickness of the resin adhesive to be thinner, and the beads that having a high amount of alkaline elements can be used without degrading the reliability of the package.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A semiconductor package comprising:
   a) at least one first semiconductor chip bonded to a die pad by an electrically conductive adhesive;
   b) at least one second semiconductor chip bonded to said die pad by an insulating adhesive;
   c) a plurality of inner leads connected by metal wires to said at least one first semiconductor chip and said at least one second semiconductor chip;
   d) a nitride film disposed on a back side of a said at least one second semiconductor chip to improve the withstand voltage between said at least one second semiconductor chip and said die pad; and
   e) said insulating adhesive comprising a plurality of insulating beads having a predetermined diameter to improve the withstand voltage between said at least one second semiconductor chip and said die pad by controlling the thickness of said insulating adhesive.

2. The semiconductor package of claim 1, the composition of alkaline elements in the insulating beads being less than 5%.

3. The semiconductor package of claim 1, said plurality of insulating beads comprising boron silicate glass.

4. The semiconductor package of claim 2, said plurality of insulating beads comprising boron silicate glass.

5. The semiconductor package of claim 1, said at least one first semiconductor chip comprising a MOSFET.

6. The semiconductor package of claim 1, said insulating adhesive comprising an epoxy resin adhesive.

7. semiconductor package comprising:
   a) at least one first semiconductor chip bonded to a die pad by an electrically conductive adhesive;
   b) at least one second semiconductor chip bonded to said die pad by an insulating adhesive;
   c) a plurality of inner leads connected by metal wires to said at least one first semiconductor chip and said at least one second semiconductor chip; and
   d) a nitride film disposed on a back side of said at least one second semiconductor chip to improve the withstand voltage between said at least one second semiconductor chip and said die pad.

8. The semiconductor package of claim 7, the thickness of said film being 2~5 $\mu$m.

9. The semiconductor package of claim 7, said insulating adhesive comprising an epoxy resin adhesive.

10. The semiconductor package of claim 8, said insulating adhesive comprising an epoxy resin adhesive.

11. A semiconductor package comprising:
    a) at least one first semiconductor chip bonded to a die pad by an electrically conductive adhesive;
    b) at least one second semiconductor chip bonded to said die pad by an insulating adhesive;

c) a plurality of inner leads connected by metal wires to said at least one first semiconductor chip and said at least one second semiconductor chip;

d) an organic insulating film disposed on a back side of said at least one second semiconductor chip to improve the withstand voltage between said at least one said semiconductor chip and said die pad; and e) said insulating adhesive comprising a plurality of insulating beads having a predetermined diameter to improve the withstand voltage between said at least one said semiconductor chip and said die pad by controlling the thickness of said insulating adhesive.

12. The semiconductor package of claim 11, said plurality of insulating beads comprising boron silicate glass.

13. The semiconductor package of claim 11, said plurality of insulating beads comprising pure $SiO_2$.

14. The semiconductor package of claim 11, the composition of alkaline elements in said plurality of insulating beads being less than 5%.

15. The semiconductor package of claim 11, said organic film comprising a benzo-cyclo-butene film.

* * * * *